(12) United States Patent
Yamaguchi

(10) Patent No.: US 6,916,725 B2
(45) Date of Patent: Jul. 12, 2005

(54) METHOD FOR MANUFACTURING SEMICONDUCTOR DEVICE, AND METHOD FOR MANUFACTURING SEMICONDUCTOR MODULE

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/757,443

(22) Filed: Jan. 15, 2004

(65) Prior Publication Data

US 2004/0161926 A1 Aug. 19, 2004

(30) Foreign Application Priority Data

Jan. 24, 2003 (JP) ........................................ 2003-015517

(51) Int. Cl.⁷ .............................................. H01L 21/46
(52) U.S. Cl. ....................... 438/459; 438/455; 438/460; 438/667

(58) Field of Search .................................. 438/459, 455, 438/460, 667, 406, 977, 612

(56) References Cited

U.S. PATENT DOCUMENTS

| | | | | |
|---|---|---|---|---|
| 6,322,903 B1 | * | 11/2001 | Siniaguine et al. | .......... 428/617 |
| 6,429,096 B1 | * | 8/2002 | Yanagida | ..................... 438/459 |
| 6,498,381 B2 | * | 12/2002 | Halahan et al. | ............. 257/449 |
| 6,800,930 B2 | * | 10/2004 | Jackson et al. | ............. 257/700 |

* cited by examiner

*Primary Examiner*—Luan Thai
(74) *Attorney, Agent, or Firm*—Oliff & Berridge, PLC

(57) ABSTRACT

To form through electrodes effectively without deteriorating the quality of the through electrodes, a semiconductor substrate is spin etched at its back surface, thereby thinning down the semiconductor substrate, making opening sections penetrate the semiconductor substrate, and forming through holes in the semiconductor substrate. Tips of embedded electrodes are exposed out of the through holes in the semiconductor substrate, to form through electrodes.

8 Claims, 7 Drawing Sheets

METHOD FOR MANUFACTURING SEMICONDUCTOR DEVICE, AND METHOD FOR MANUFACTURING SEMICONDUCTOR MODULE

BACKGROUND OF THE INVENTION

1. Field of Invention

The present invention relates to methods to manufacture semiconductor devices and methods to manufacture semiconductor modules, and in particular, is applied to methods to form through electrodes in a substrate.

2. Description of Related Art

In related art semiconductor devices, to realize a stacked layered structure of semiconductor chips, there is a method in which through holes are formed in semiconductor substrates, and the semiconductor substrates are interconnected via through electrodes that are embedded in the through holes.

FIGS. 8(a)–8(d) are cross-sectional views indicating a related art method to manufacture a semiconductor device.

Referring to FIG. 8(a), pad electrodes 52 are formed on a surface 51' of a semiconductor substrate 51. Opening sections 53 are formed through the pad electrodes 52 in the semiconductor substrate 51. Next, as indicated in FIGS. 8(b) and(c), dielectric films 54 are formed inside the opening sections 53, and embedded electrodes 57 are formed inside the opening sections 53. As indicated in FIG. 8(d), by dry etching a back surface 51" of the semiconductor substrate 51, the semiconductor substrate 51 is thinned down, thereby making the opening sections 53 penetrate the semiconductor substrate 51. By this, through holes 53' are formed in the semiconductor substrate 51, the dielectric films 54 are removed, and tips of the embedded electrodes 57 are exposed. As a result, through electrodes 57' are formed.

However, in the related art method to manufacture semiconductor devices, dry etching is used to expose the tips of the through electrodes 57'. When the dry etching is used in this manner, the etching speed is slow, and therefore the throughput of semiconductor devices is lowered.

However, if wet etching is used to increase the etching speed, variations in the etching amount may occur depending on locations of semiconductor substrates. Consequently, height variations may occur in portions where the through electrodes 57' protrude from the surface of the semiconductor substrate 51. In this case, when the semiconductor substrate 51 is connected to another semiconductor substrate or a circuit substrate, tip portions of the semiconductor substrate 51 may come in contact with the other semiconductor substrate or the circuit substrate, which causes a problem of lowered reliability.

Therefore, the present invention provides a method to manufacture semiconductor devices and a method to manufacture semiconductor modules, which realize highly reliable semiconductor devices, and are capable of forming through electrodes in good shapes.

SUMMARY OF THE INVENTION (1) A method to manufacture a semiconductor device in accordance with an aspect of the present invention includes: forming opening sections in a semiconductor substrate; a step of forming embedded electrodes inside the opening sections; and spin etching the semiconductor substrate from the back of a surface of the semiconductor substrate where the opening sections are formed, to thereby thin down the semiconductor substrate and make the opening sections penetrate the semiconductor substrate.

The semiconductor substrate is thinned down by spin etching. By this, the opening sections are made to penetrate the semiconductor substrate, such that the embedded electrodes penetrate the semiconductor substrate. Consequently, the through electrodes can be formed in the semiconductor substrate without harming the flatness of a non-etching surface of the semiconductor substrate. Also, the semiconductor substrate can be thinned down and the through electrodes can be formed in a short time. For this reason, the through electrodes can be effectively formed without lowering the reliability of semiconductor devices, and the throughput of the semiconductor devices can be enhanced.

(2) Also, in (1) above, the method to manufacture a semiconductor device may further include: forming dielectric films inside the opening sections before forming the embedded electrodes inside the opening sections; and exposing at least one part of the dielectric films when making the opening sections penetrate the semiconductor substrate. As a result, the dielectric films can function as etching stopper layers in the spin etching, such that an etching finish point can be readily detected. Accordingly, the protrusion height of the through electrodes from the surface of the semiconductor substrate can be made more uniform.

(3) Furthermore, in (2) above, the method to manufacture a semiconductor device may further include removing the dielectric films before making the opening sections penetrate the semiconductor substrate to expose the embedded electrodes. As a result, the embedded electrodes can be reduced or prevented from being eroded by the spin etching. Accordingly, the reliability of semiconductor devices can be further enhanced.

(4) Furthermore, the manufacturing method described in any one of (1) through (3) above may further include grinding the semiconductor substrate from the back thereof before making the opening sections penetrate the semiconductor substrate. As a result, the speed of thinning the semiconductor substrate can be further increased, and the flatness of a non-etching surface of the semiconductor substrate can be enhanced while lowering of the throughput can be suppressed.

(5) Furthermore, the manufacturing method described in any one of (1) through (4) above may be characterized in that, in making the opening sections penetrate the semiconductor substrate, an etching rate for the semiconductor substrate changes with time. In this case, the etching rate for the semiconductor substrate may be characterized to change from a first etching rate to a second etching rate that is lower than the first etching rate. Consequently, a gradual decline in etching rate that takes place for an extended period of time can be reduced or prevented, and surface variations in the etching amount of the semiconductor substrate can be reduced. As a result, while suppressing a decline in the throughput of semiconductor devices, the uniformity in the protrusion height of the through electrodes can be enhanced.

(6) Also, the method to manufacture a semiconductor device recited in (3) above may be characterized in that, in the exposing the embedded electrodes, the dielectric films are removed by grinding the dielectric films exposed. As a result, the dielectric films at the tips of the embedded electrodes can be effectively abutted against the ground surfaces, such that the embedded electrodes can be effectively exposed. Accordingly, the throughput of semiconductor devices can be enhanced. The grinding can be at least one of mechanical grinding and CMP. When mechanical grinding is used, the grinding speed is readily enhanced, and the throughput can be enhanced. Also, when CMP is used, while controlling damages that may be inflicted on the semiconductor substrate, and enhancing the flatness of the surface of the semiconductor substrate, the semiconductor substrate can be readily thinned down or the dielectric films can be readily removed.

(7) Furthermore, the manufacturing method described in any one of (1) through (6) above may further include' attaching a retaining member on the surface of the semiconductor substrate where the opening sections are formed, before making the opening sections penetrate the semiconductor substrate. As a result, even when the semiconductor substrate is thinned down, warping or cracks in the semiconductor substrate can be reduced or prevented and; while the semiconductor substrate can be made larger, and handling of the semiconductor substrate is facilitated, the throughput of semiconductor devices can be readily enhanced.

(8) The manufacturing method described in (7) above may be characterized in that the retaining member includes a base member and an adhesive layer provided on a surface of the base member, and the base member is one of a tape, a film, a light-transmissive substrate and another substrate. Here, if a tape or a film having an adhesive layer formed thereon is used as the retaining member, the retaining member can be readily adhered and removed. Also, if a light-transmissive substrate is used as the base member, light can be irradiated on the adhesive layer through the light-transmissive substrate, and the retaining member can be readily adhered and removed. Also, if another semiconductor substrate is used as the base member, its elastic modulus and coefficient of thermal expansion can be matched with those of the semiconductor substrate, such that the semiconductor substrate can be stably retained.

(9) A method to manufacture a semiconductor module in accordance with an aspect of the present invention includes: forming opening sections in a first semiconductor substrate; forming embedded electrodes inside the opening sections; spin etching the semiconductor substrate from the back of a surface of the semiconductor substrate where the opening sections are formed, to thereby thin down the semiconductor substrate and make the opening sections penetrate the semiconductor substrate; and mounting the first semiconductor substrate on a second semiconductor substrate having electrodes, and electrically connecting the embedded electrodes and the electrodes.

As a result, the semiconductor substrate can be thinned down by spin etching, and through electrodes can be formed in the semiconductor substrate without harming the flatness of the non-etching surface. Also, the semiconductor substrate can be thinned down and the through electrodes can be exposed in a short time. For this reason, the through electrodes can be effectively formed without lowering the reliability of semiconductor devices, and the throughput of semiconductor devices can be enhanced. Also, a stacked layered structure of semiconductor substrates can be precisely composed.

DETAILED DESCRIPTION OF EXEMPLARY EMBODIMENTS

Hereafter, a method to manufacture a semiconductor device and a method to manufacture a semiconductor module will be described with reference to the accompanying figures.

Figure 1:
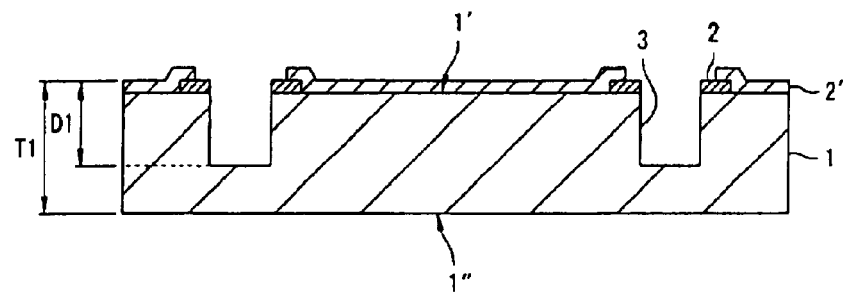
FIGS. 1(a)–1(d) are cross-sectional views indicating a method to manufacture a semiconductor device in accordance with an exemplary embodiment of the present invention.
Figure 1:
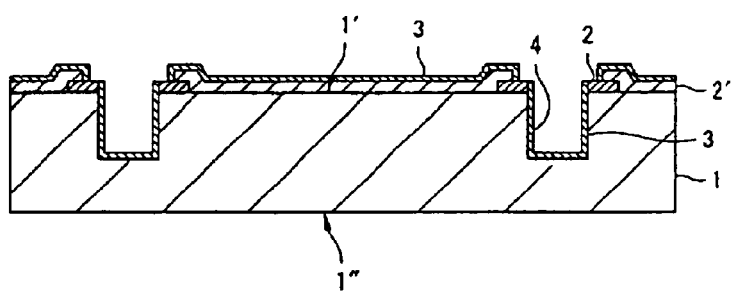
Figure 1:
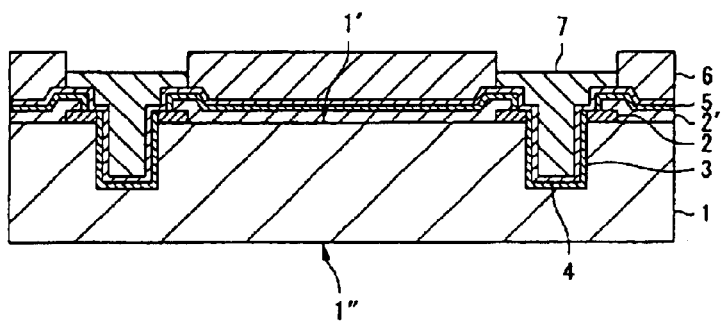
Figure 1:
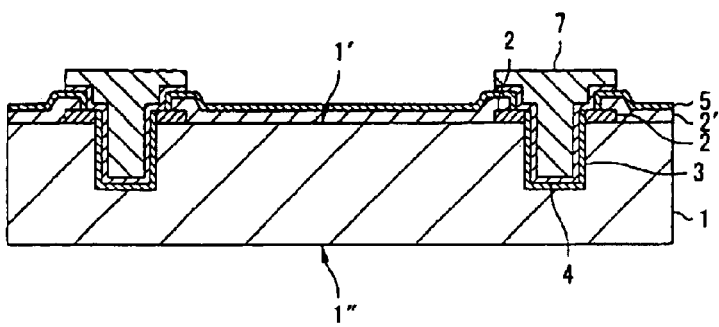
Figure 2:
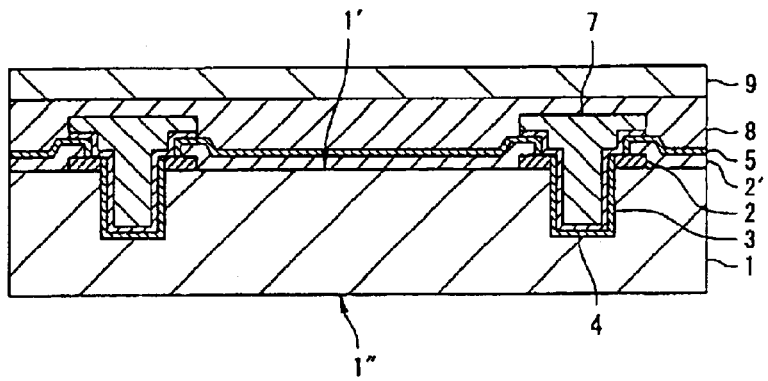
FIGS. 2(a)–2(d) are cross-sectional views indicating a method to manufacture a semiconductor device in accordance with an exemplary embodiment of the present invention.
Figure 2:
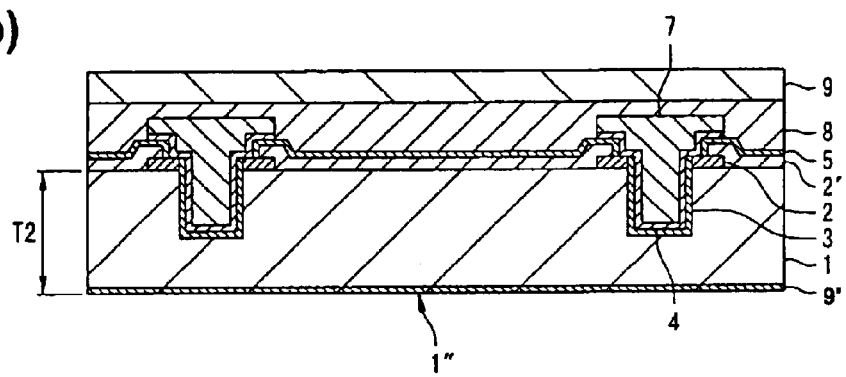
Figure 2:
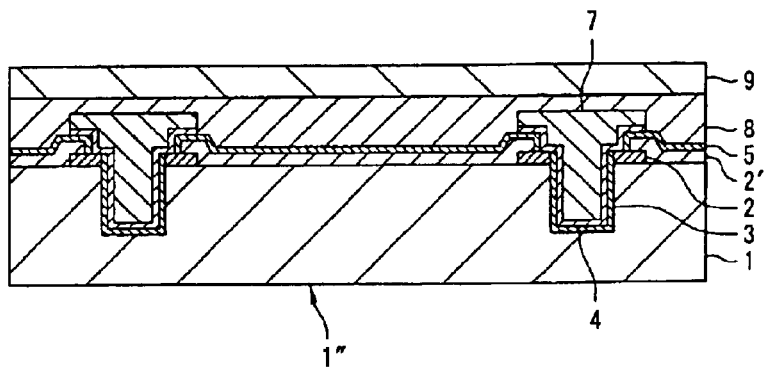
Figure 2:
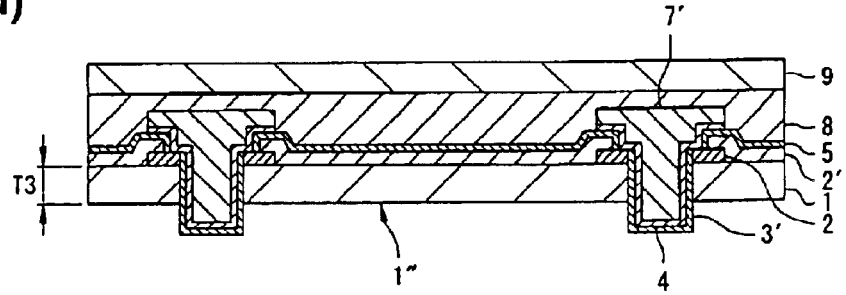
Figure 3:
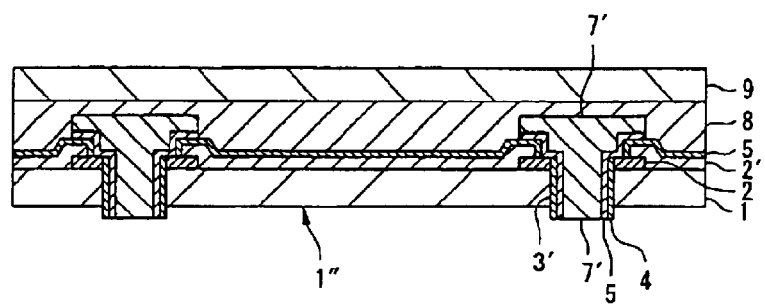
FIGS. 3(a)–3(b) are cross-sectional views indicating a method to manufacture a semiconductor device in accordance with an exemplary embodiment of the present invention.
Figure 3:
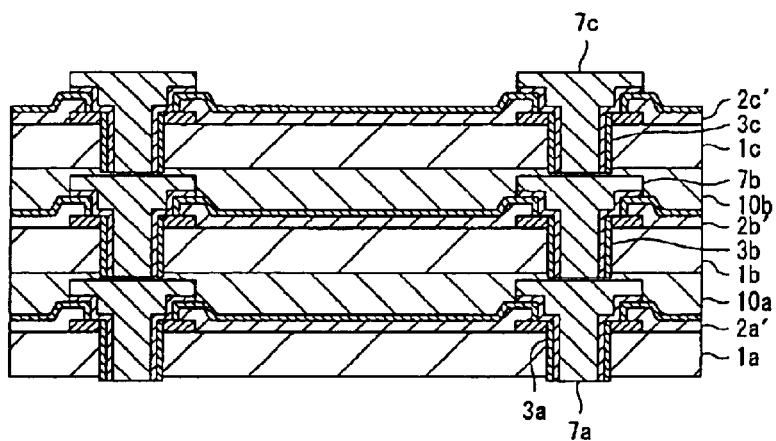

FIGS. 1 through 3 are cross-sectional views indicating a method to manufacture a semiconductor device in accordance with an exemplary embodiment of the present invention.

Referring to FIG. 1(a), electrode pads 2 are formed on a surface 1' of a semiconductor substrate 1. The semiconductor substrate 1 may be a semiconductor wafer or a semiconductor chip that is one of segments of a semiconductor wafer. An integrated circuit is formed within the semiconductor substrate 1, and the electrode pads 2 are electrically connected to the integrated circuit. The semiconductor substrate 1 may have a dielectric film 2' as a passivation film for the electrode pads 2 over the surface 1'. In this case, the passivation film may have opening sections at positions over the electrode pads 2.

Next, opening sections 3 are formed in the semiconductor substrate 1. For example, a photolithography technique and an etching technique may be used to form the opening sections 3. The opening sections 3 may be formed in regions that include the electrode pads 2 of the semiconductor substrate 1. For example, the opening sections 3 may penetrate the electrode pads 2. The opening area of each opening section 3 may be smaller than the opening area of each opening section in the passivation film. After the opening sections 3 are formed, at least part of the upper surfaces of-the electrode pads 2 may be exposed to the inside of the opening sections in the passivation film. A plurality of the opening sections 3 are provided in the semiconductor substrate 1. The plural opening sections 3 may have the same depth, or different depths.

Here, the depth D1 of the opening sections 3 is smaller than the thickness T1 of the semiconductor substrate 1. For example, the opening sections 3 are deeply formed in the thickness direction of the semiconductor substrate 1, such that their bottom sections are formed within the semiconductor substrate 1. For example, the thickness T1 of the semiconductor substrate 1 can be 625 $\mu$m when a 6-inch wafer is used, and 725 $\mu$m when an 8-inch wafer is used; and the depth D1 of the opening sections 3 can be, for example, 70 $\mu$m.

It is noted that the opening sections 3 in the semiconductor substrate 1 may be formed by a method using an etching technique, such as dry etching or wet etching, or may be formed by using a laser technique. The opening sections 3 are formed in a manner that their side surfaces may be perpendicular to the surface 1' of the semiconductor substrate 1, and cross sections of the opening sections may be in a cylindrical shape. Also, the opening sections 3 may be formed in a manner such that their cross sections are in a barrel shape or an hourglass shape.

Next, as indicated in FIG. 1(*b*), dielectric films 4 are formed on bottom surfaces and side surfaces within the opening sections 3. Also, the dielectric film may be formed on the surface of the semiconductor substrate 1. For example, the dielectric films 4 may be formed by CVD or thermal oxidation. It is noted that, as the dielectric film 4, for example, a silicon oxide film, a silicon nitride film or a resin film may be used.

Next, as indicated in FIG. 1(*c*), conductive films 5 may be formed over the semiconductor substrate 1 including the interior of the opening sections 3. The conductive films 5 may be formed by sputtering or vapor deposition. As the conductive films 5, conductive material, such as, for example, nickel(Ni), chrome(Cr), titanium(Ti), tungsten (W), titanium tungsten(TiW) or titanium nitride(TiN) can be used. The conductive films 5 may be plated electrodes that are provided when embedded electrodes 7, to be described below, are formed by a plating method, or barrier metal of the embedded electrodes 7. In this case, the conductive films 5 may be composed of conductive material that has a lower diffusion coefficient for semiconductor material than that of conductive material composing the embedded electrodes 7. Also, the conductive films 5 may be reflection prevention films, or coherency improvement films for the embedded electrodes 7 to the semiconductor substrate 1.

Next, a resist layer 6 having opening sections 6' provided at positions corresponding to the opening sections 3 may be formed on the semiconductor substrate 1 on which seed electrodes 5 are formed. The opening area of each opening section 6' may be larger than the opening area of each opening section 3. Also, the opening area of each opening section 6' may be larger than the opening area of each opening section formed in the passivation film.

Then, embedded electrodes 7 are formed inside the opening sections 3. The embedded electrodes 7 may be formed by using an electrolytic plating method using the conductive films 5 as plating electrodes. Besides an electrolytic plating method, for example, an ink jet method may be used whereby the embedded electrodes 7 are formed through injecting conductive slurry or conductive paste inside the opening sections 3, or an electroless plating method may be used, or a sputtering method or a CVD method may be used. As the embedded electrodes 7, for example, nickel(Ni), copper(Cu), gold(Au), tungsten(W), a composite of the above, or an alloy of the above may be used.

The embedded electrodes 7 may be provided not only inside the opening sections 3 but also on the surface 1' of the semiconductor substrate 1. In this case, they may be provided covering top surfaces of the electrode pads 2. The embedded electrodes 7 may also be provided on the dielectric films 4 over the surface 1' of the semiconductor substrate. Also, the embedded electrodes 7 may be provided not only inside the opening sections 3 but also inside the opening sections 6' provided in the plating resist layer 6. In other words, the embedded electrodes 7 can be formed to protrude over the opening sections 3 such that they embed not only the opening sections 3 but also the opening sections 6'. Accordingly, the embedded electrodes 7 may be formed protruding over the surface 1' of the semiconductor substrate. As a result, in a stacked layered structure of the semiconductor substrates 1 shown in FIG. 3(*d*), interlayer connections can be more stably provided Next, as indicated in FIG. 1(*d*), the plating resist layer 6 may be removed. Further, as indicated in FIG. 2(*a*), a retaining member 9 may be attached to the surface 1' of the semiconductor substrate 1. Here, the retaining member 9 includes a base member and an adhesive layer 8 that is provided on a surface of the base member and can be removed from the base member. By attaching the retaining member 9 through the adhesive layer 8 on the surface 1' of the semiconductor substrate 1, the semiconductor substrate 1 can be supported while facilitating attachment and removal of the retaining member 9. For example, the retaining member 9 may include a base member, such as a tape or a film, that is formed from resin or cloth, and an adhesive layer formed on the surface of the base member.

Also, the base member of the retaining member 9 may be a light-transmissive substrate. In this case, light can be irradiated on the adhesive layer through the base member. Accordingly, by using a photosensitive adhesive layer as the adhesive layer, the retaining member 9 can be readily attached or removed. For example, the light-transmissive substrate may be a glass substrate. Further, the base member of the retaining member 9 may be a semiconductor substrate. In this case, if thermo-sensitive adhesive material is used as material that composes the adhesive layer, the elastic modulus and coefficient of thermal expansion of the retaining member can be approximated to those of the semiconductor substrate 1. Accordingly, the semiconductor substrate 1 can be stably retained by the retaining member 9.

Next, as indicated in FIGS. 2(*b*)–2(*d*), the semiconductor substrate 1 is thinned down, to thereby make the opening sections 3 penetrate the semiconductor substrate 1. Consequently, the embedded electrodes 7 within the opening sections 3 penetrate the semiconductor substrate 1, such that through electrodes 7' are formed.

In the processing of thinning the semiconductor substrate 1, the back surface 1" of the semiconductor substrate 1 may be initially ground to thin down the semiconductor substrate 1. For the grinding, mechanical grinding may be used, or CMP may be used. The semiconductor substrate 1 may be ground while it is retained by the retaining member 9. In this case, grinding of the back surface 1" of the semiconductor substrate 1 is finished before the dielectric films 4 or the embedded electrodes 7 are exposed. In other words, the thickness T2 of the semiconductor substrate 1 after grinding is smaller than the thickness of the semiconductor substrate 1 before grinding, and greater than the depth D1 of the opening sections 3. For example the thickness T2 of the semiconductor substrate 1 after grinding can be 100 $\mu$m. When the back surface 1" of the semiconductor substrate 1 is ground, a crushed layer 9' of the semiconductor substrate 1 may be formed on the back surface 1".

Figure 4:
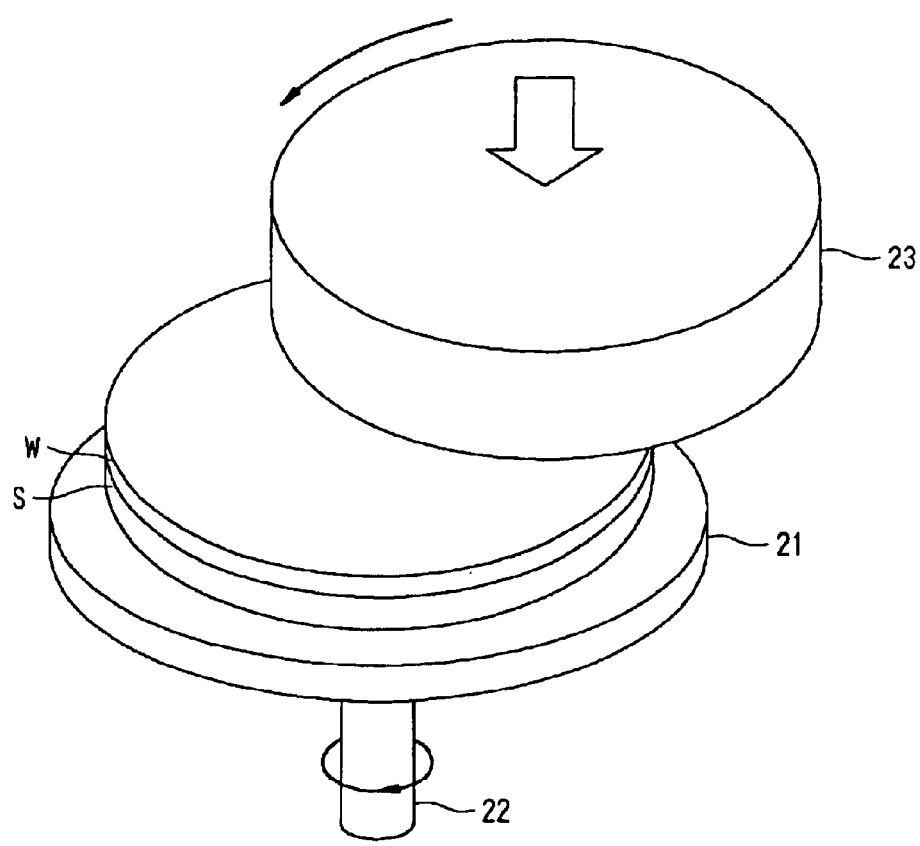
FIG. 4 is a perspective view indicating a method to grind a semiconductor substrate in accordance with an exemplary embodiment of the present invention.

FIG. 4 is a perspective view indicating one example of a method to manufacture a semiconductor device in accordance with an exemplary embodiment of the present invention when grinding is conducted in the process of thinning down the semiconductor substrate 1.

Referring to FIG. 4, a table 21 for mounting a semiconductor substrate 1 is provided with a rotary shaft 22. A grindstone 23 is provided over the table 21. On the other hand, a retaining member S for retaining the semiconductor substrate W may be stuck to the surface 1' of the semiconductor substrate 1.

When the back surface 1" of the semiconductor substrate 1 is ground, the surface 1' of the semiconductor substrate 1 is placed on the table 21, and the back surface 1" of the semiconductor substrate 1 is faced toward the grindstone 23. The grinding surface of the grindstone 23 is brought in contact with the back surface 1" of the semiconductor substrate 1, the grindstone 12 is pressed against the back surface 1" of the semiconductor substrate 1, and the grindstone 12 is rotated. Further, the table 21 may be rotated with the rotary shaft 22 as its center, to rotate the semiconductor substrate 1. Accordingly, by increasing the rotation speed of at least one of the semiconductor substrate 1 and the grindstone 23, the speed of grinding the back surface of the semiconductor substrate 1 can be readily increased. Consequently, the process of thinning down the semiconductor substrate 1 can be conducted in a shorter time. Also, the grinding surface of the grindstone 23 may be partially brought in contact with the back surface of the semiconductor substrate 1 for grinding, the speed distribution of the grindstone 23 at the time of grinding the back surface of the semiconductor substrate 1 can be made uniform, and the uniformity of the thickness of the semiconductor wafer W can be maintained.

Next, as indicated in FIG. 2(d), the back surface 1" of the semiconductor substrate 1 is spin etched, to thereby thin down the semiconductor substrate 1, and make the opening sections 3 penetrate the semiconductor substrate 1 to form through holes 3' in the semiconductor substrate 1. By this, the dielectric films 4 or at least tips of the embedded electrodes 7 are exposed. Spin etching is an etching process that is performed while the semiconductor substrate 1 is rotated. Here, the etching may be wet etching or dry etching. If a chemical solution is used for the spin etching, a mixed solution of hydrofluoric acid and nitric acid may be used, for example.

Consequently, when the semiconductor substrate 1 is thinned down and the through electrodes 7' are formed, the flatness of the non-etching surface of the semiconductor substrate can be maintained, and the dielectric films 4 or the tips of the embedded electrodes 7 can be exposed with-good precision. The time required to thin the semiconductor substrate 1 and form the through electrodes 7' can be shortened. Also, if a crushed layer 9' is formed on the semiconductor substrate 1 at the time of grinding, the crushed layer 9' can be removed; in other words, the removal of the crushed layer 9' can also be simultaneously performed. For this reason, the through electrodes 7' can be effectively formed in the semiconductor substrate 1 without deteriorating the quality of the through electrodes 7', and the throughput of semiconductor devices can be enhanced.

When the through holes 3' are formed, at least part of the dielectric films 4 within the opening sections 3 may be exposed. When the through holes 3' are formed, the dielectric films 4 may also be removed at the same time, to expose the tips of the embedded electrodes 7. The thickness T3 of the semiconductor substrate 1 after spin etching is smaller than the thickness T1 of the semiconductor substrate 1, and smaller than the depth of the opening sections 3. For example, the thickness T3 of the semiconductor substrate 1 can be 50 μm.

Figure 5:
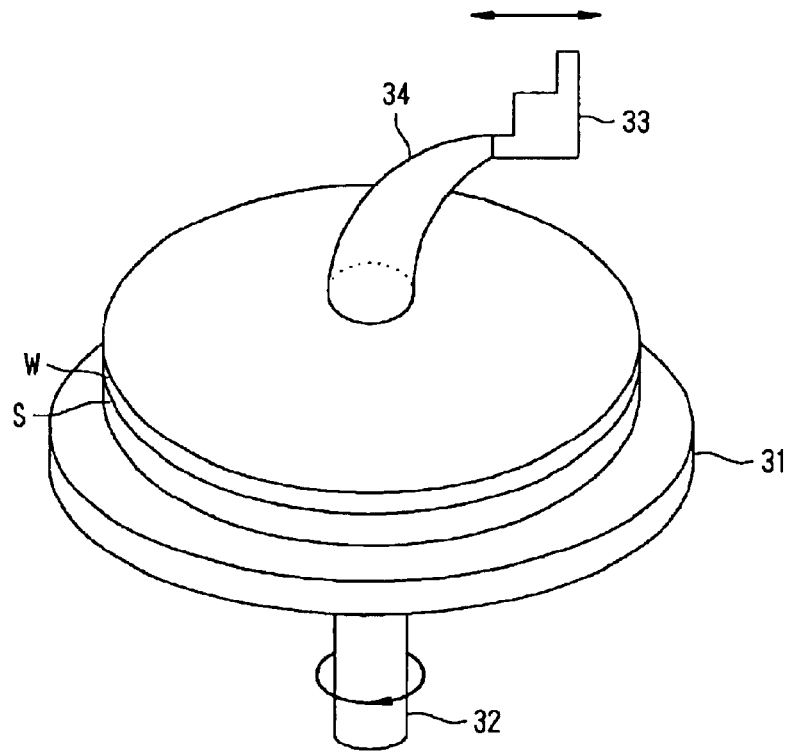
FIG. 5 is perspective view indicating a method to spin etch a semiconductor substrate in accordance with an exemplary embodiment of the present invention.

FIG. 5 is a perspective view indicating one example of the step of spin etching a semiconductor substrate 1 in a method to manufacture a semiconductor device in accordance with an exemplary embodiment of the present invention.

Referring to FIG. 5, a table 31 for mounting a semiconductor substrate 1 is provided with a rotary shaft 32, and a chemical solution supply section 33 for supplying a chemical solution 34 is provided over the table 31. On the other hand, a retaining member 9 for retaining the semiconductor substrate 1 may be stuck to the surface 1' of the semiconductor substrate 1.

When the back surface 1" of the semiconductor substrate 1 is spin etched, the semiconductor substrate 1 is mounted on the table 31 in a manner that the surface 1' (the surface where the retaining member 9 is provided, if the retaining member 9 is provided) of the semiconductor substrate 1 is faced toward the surface of the table 31, and the back surface 1" of the semiconductor substrate 1 is faced toward the chemical solution supply section 33.

Then, the index table 32 is rotated with the rotary shaft 32 as its center, to rotate the semiconductor substrate 1, and the chemical solution 34 is dropped on the back surface 1" of the semiconductor substrate 1 while the chemical solution supply section 33 is moved above the semiconductor substrate 1, whereby the semiconductor substrate 1 is etched from its back surface.

For contacting the chemical solution 34 with the back surface 1" of the semiconductor substrate 1, the chemical solution 34 may be jetted against the back surface 1" of the semiconductor substrate 1, or the chemical solution 34 may be made into a vapor state such that the back surface of the semiconductor substrate 1 is exposed to the chemical solution 34.

Figure 6:
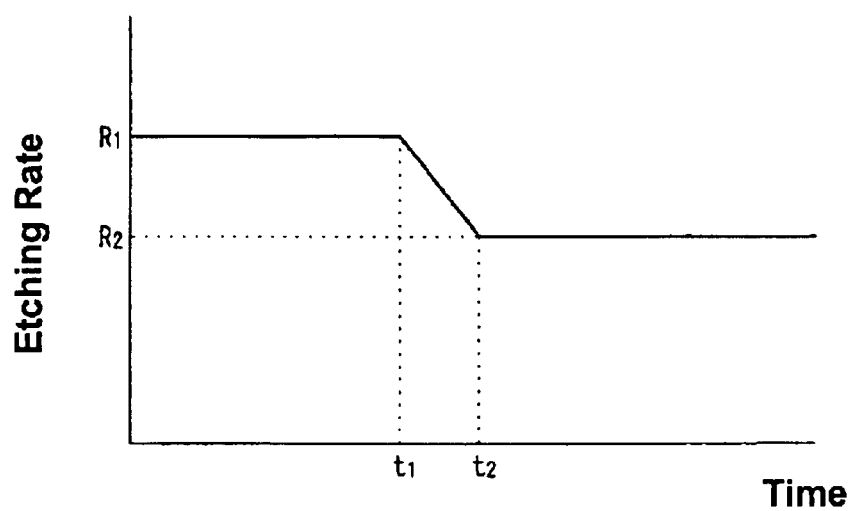
FIG. 6 is a schematic indicating a method to set etching rates in the spin etching process.

FIG. 6 is a schematic indicating the relation between an etching rate and time in the process of spin etching the semiconductor substrate 1 in a method to manufacture a semiconductor device in accordance with an exemplary embodiment of the present invention.

FIG. 6 indicates that, in the process of spin etching the semiconductor substrate 1, the etching is conducted while multiple conditions with different etching rates for the semiconductor substrate 1 are switched. In other words, in the process of spin etching the semiconductor substrate 1, the etching is conducted in a manner that the etching rate for the semiconductor substrate 1 changes with time.

For example, in FIG. 6, a condition in which the etching rate for the semiconductor substrate 1 is R1 in the process of spin etching the semiconductor substrate 1 is used to thereby spin etch the back surface 1" of the semiconductor substrate 1 to thin down the semiconductor substrate 1. Next, a condition in which the etching rate for the semiconductor substrate 1 is R2 that is lower than R1 is used to thereby spin etch the back surface 1" of the semiconductor substrate 1.

FIG. 6 indicates one example in which the etching rate is changed with time. However, the present invention is not limited to this example, and may also be applicable when the etching rate does not change with time.

As a result, as indicated in FIG. 2(d), the opening sections 3 penetrate the semiconductor substrate 1. The dielectric films 4 or the tips of the embedded electrodes 7 can be exposed with good precision.

Consequently, a gradual decline in etching rate of the spin etching that takes place for an extended period of time can be reduced or prevented, and surface variations in etching amount in the spin etching can be reduced. As a result, the uniformity in the protrusion height of the through electrodes 7' can be enhanced, while suppressing a decline in the throughput of semiconductor devices.

Next, as indicated in FIG. 3(a), the dielectric films 4 at the tips of the through electrodes 7' are removed. In this case, the dielectric films 4 at the tips of the through electrodes 7' may be removed by grinding. Since the tips of the through electrodes 7' protrude from the back surface of the semiconductor substrate 1, when the back surface of the semiconductor substrate 1 is mounted on a grinding surface, the dielectric films 4 at the tips of the through electrodes 7' can be strongly pressed against the grinding surface. For this reason, the dielectric films 4 at the tips of the through electrodes 7' can be effectively exposed when the grinding process is used. Accordingly, by grinding the dielectric films 4 at the tips of the through electrodes 7' by the grinding process, the dielectric films 4 at the tips of the through electrodes 7' can be effectively removed.

Figure 7:
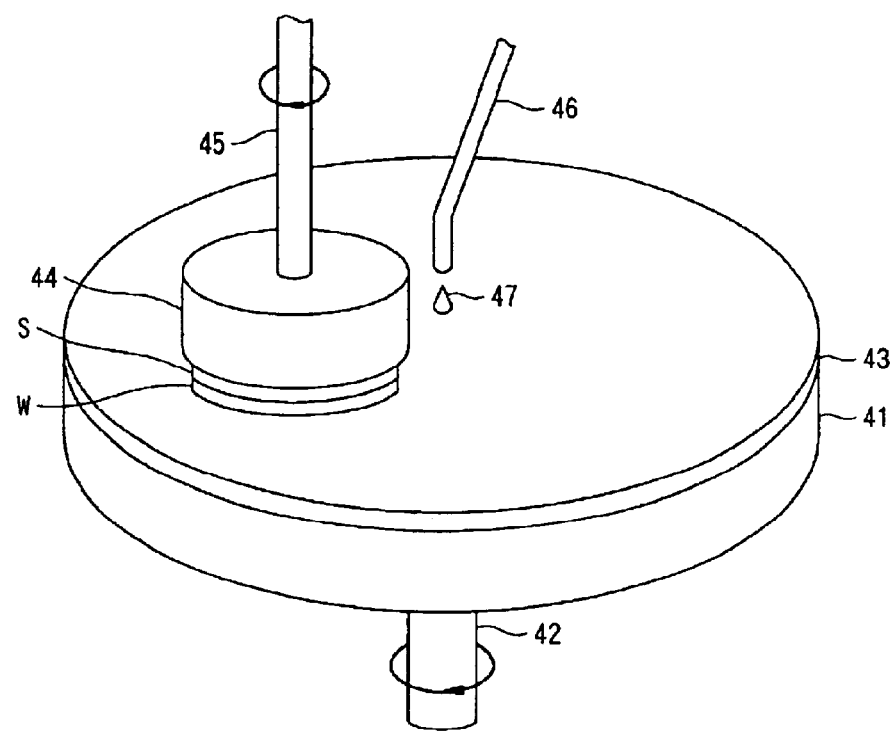
FIG. 7 is a perspective view indicating a CMP method for a semiconductor substrate in accordance with an exemplary embodiment of the present invention.
Figure 8:
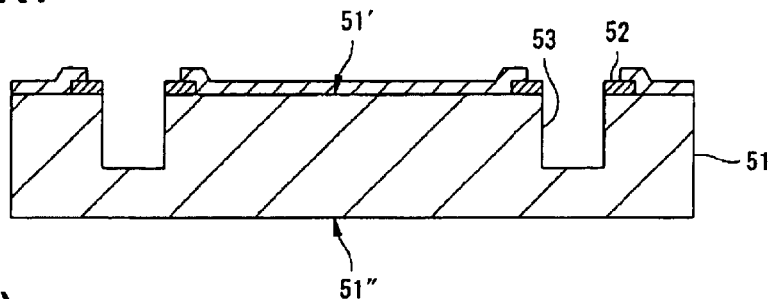
FIGS. 8(a)–8(d) are cross-sectional views indicating a related art method to manufacture a semiconductor device.
Figure 8:
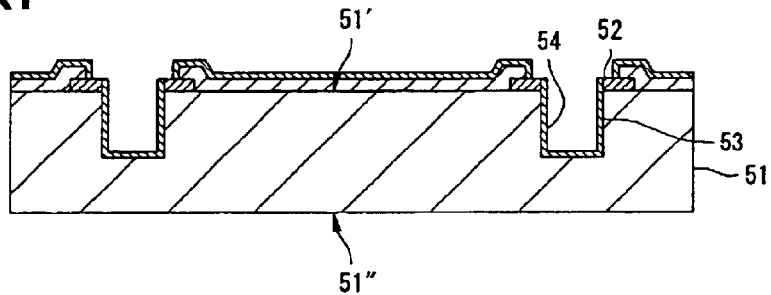
Figure 8:
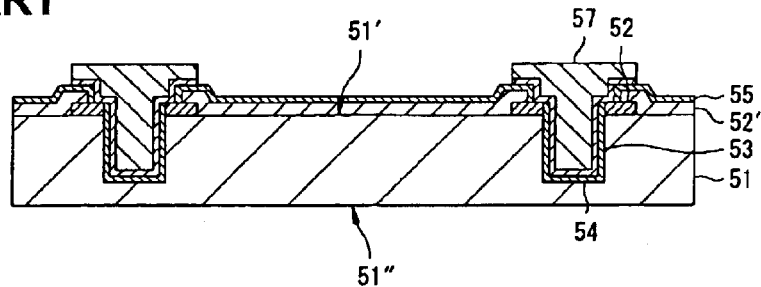
Figure 8:
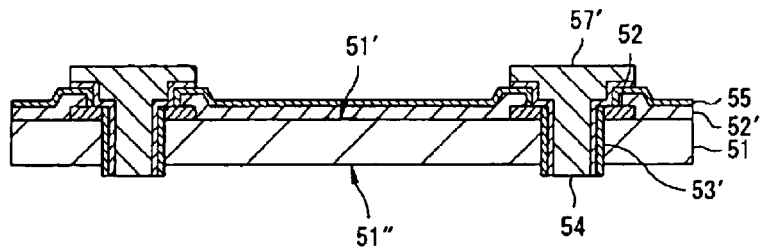

For grinding the dielectric films 4 provided at the tips of the through electrodes 7', a grinding process, such as mechanical grinding or CMP(chemical mechanical polishing) indicated in FIG. 7, or etching can be used.

FIG. 7 is a perspective view indicating one example of the step of grinding the dielectric films 4 in a method to manufacture a semiconductor device in accordance with an exemplary embodiment of the present invention. In the example shown in FIG. 7, an example that uses CMP (Chemical Mechanical Polishing) is indicated. In this case, while supplying slurry 47 onto the back surface 1" of the semiconductor substrate 1, the back surface 1" of the semiconductor substrate 1 is mechanically polished to thereby conduct CMP. CMF may be conducted in a state in which a retaining member 9 is formed on the surface 1' of the semiconductor substrate 1. Consequently, the dielectric films 4 at the tips of the through electrodes 7' can be effectively removed, while controlling damages that may be inflicted on the semiconductor substrate 1, and maintaining the uniformity of the protrusion height of the through electrodes 7'.

By the process described above, a semiconductor device including the semiconductor substrate 1 having through electrodes 7 can be manufactured.

Next, semiconductor devices thus manufactured are stacked in layers, to thereby form a semiconductor module. A semiconductor substrate 1 including through electrodes 7 is mounted on another semiconductor substrate including electrodes, and the electrodes and the through electrodes 7 are electrically connected to one another. As indicated in FIG. 3(b), semiconductor substrates 1a–1c, which correspond to the semiconductor substrate 1, are stacked in layers in a manner that through electrodes 7a–7c, which correspond to through electrodes 7 formed in the respective semiconductor substrates 1a–1c, are connected to one another. Resin 10a and 10b may be provided in gaps between the semiconductor substrates 1a–1c. In this manner, a semiconductor module including a stacked layered structure of the semiconductor substrates 1a–1c is manufactured.

Consequently, the through electrodes 7a–7c are effectively formed without deteriorating the quality of the through electrodes 7a–7c, and the throughput at the time of forming the through electrodes 7a–7c can be enhanced, and the stacked layered structure of the semiconductor substrates 1a–1c can be composed with good precision.

In the exemplary embodiments described above, a method in which through electrodes are formed in a semiconductor substrate 1 is described. However, without being limited to the semiconductor substrate 1, the present invention is also applicable to methods to manufacture electronic devices and electronic modules in which through electrodes are formed in a substrate having active elements formed thereon. For example, the present invention may be applied to a method of forming through electrodes in a glass substrate having thin film transistors and the like formed thereon.

As described above, in accordance with an aspect of the present invention, since through electrodes are formed by using spin etching, the through electrodes can be effectively formed without deteriorating the quality of the through electrodes.

What is claimed is:

1. A method to manufacture a semiconductor device, comprising:

forming opening sections in a semiconductor substrate;

forming dielectric films on bottom surfaces and side surfaces within the opening sections;

forming embedded electrodes inside the opening sections after forming the dielectric films on bottom surfaces and side surfaces within the opening sections;

spin etching the semiconductor substrate from a back surface of a surface of the semiconductor substrate where the opening sections are formed, to expose at least a part of the dielectric films formed on the bottom surfaces within the opening sections and make the opening sections penetrate the semiconductor substrate; and removing at least the part of the dielectric films formed on the bottom surfaces within the opening sections to expose the embedded electrodes.

2. The method to manufacture a semiconductor device according to claim 1, further comprising:

grinding the semiconductor substrate from the back surface thereof before making the opening sections penetrate the semiconductor substrate.

3. The method to manufacture a semiconductor device according to claim 1, in making the opening sections penetrate the semiconductor substrate, an etching rate for the semiconductor substrate changing with time.

4. The method to manufacture a semiconductor device according to claim 1, in making the opening sections penetrate the semiconductor substrate, the etching rate for the semiconductor substrate changing from a first etching rate to a second etching rate that is lower than the first etching rate.

5. The method to manufacture a semiconductor device according to claim 1, in exposing the embedded electrodes, the dielectric films are removed by grinding the dielectric films exposed.

6. The method to manufacture a semiconductor device according to claim 1, further comprising:

attaching a retaining member on the surface of the semiconductor substrate where the opening sections are formed, before making the opening sections penetrate the semiconductor substrate.

7. The method to manufacture a semiconductor device according to claim 6, the retaining member including a base member and an adhesive layer provided on a surface of the base member, and the base member being one of a tape, a film, a light-transmissive substrate and another substrate.

8. A method to manufacture a semiconductor module, comprising:

forming opening sections in a first semiconductor substrate;

forming dielectric films on bottom surfaces and side surfaces within the opening sections, forming embedded electrodes inside the opening sections after forming the dielectric films on bottom surfaces and side surfaces within the opening sections;

spin etching the semiconductor substrate from a back surface of a surface of the semiconductor substrate where the opening sections are formed, to expose at least a part of the dielectric films formed on the bottom surfaces within the opening sections and make the opening sections penetrate the semiconductor substrate;

removing at least the part of the dielectric films formed on the bottom surfaces within the opening sections to expose the embedded electrodes; and mounting the first semiconductor substrate on a second semiconductor substrate having electrodes, and electrically connecting the embedded electrodes and the electrodes.

* * * * *